United States Patent
Staudinger et al.

(10) Patent No.: US 10,438,906 B2
(45) Date of Patent: Oct. 8, 2019

(54) RADIO FREQUENCY (RF) INDUCTIVE SIGNAL COUPLER AND METHOD THEREFOR

(71) Applicant: NXP USA, INC., Austin, TX (US)

(72) Inventors: Joseph Staudinger, Austin, TX (US); James Krehbiel, Austin, TX (US)

(73) Assignee: NXP USA, INC., Austin, TX (US)

( * ) Notice: Subject to any disclaimer, the term of this patent is extended or adjusted under 35 U.S.C. 154(b) by 184 days.

(21) Appl. No.: 15/371,280

(22) Filed: Dec. 7, 2016

(65) Prior Publication Data

US 2018/0158786 A1    Jun. 7, 2018

(51) Int. Cl.
| H01L 23/64 | (2006.01) |
| H01L 27/01 | (2006.01) |
| H01L 49/02 | (2006.01) |
| H01L 23/66 | (2006.01) |
| H01L 21/70 | (2006.01) |

(52) U.S. Cl.
CPC .......... H01L 23/645 (2013.01); H01L 21/707 (2013.01); H01L 23/66 (2013.01); H01L 27/016 (2013.01); H01L 28/10 (2013.01); H01L 28/20 (2013.01); H01L 28/60 (2013.01); H01L 2223/6672 (2013.01)

(58) Field of Classification Search
CPC ........ H01L 23/645; H01L 28/10; H01L 28/60
See application file for complete search history.

(56) References Cited

U.S. PATENT DOCUMENTS

| 7,305,223 | B2 | 12/2007 | Liu et al. |
| 7,714,679 | B2 | 5/2010 | Jiang |
| 7,869,784 | B2 | 1/2011 | Liu |
| 8,035,458 | B2 * | 10/2011 | Frye ........................ H01L 23/64 |
| | | | 333/109 |
| 8,760,240 | B2 | 6/2014 | Yehezkely |
| 8,810,042 | B2 * | 8/2014 | Nakashiba .............. H01L 23/48 |
| | | | 257/499 |
| 9,013,246 | B2 | 4/2015 | Holmes et al. |
| 9,093,734 | B2 | 7/2015 | Gorbachov |
| 2008/0122560 | A1 | 5/2008 | Liu |

OTHER PUBLICATIONS

Ye, L., et al., "Miniature Cmos Stacked Spiral-Coupled Directional Coupler With -67 -dB Isolation and -0.8 -dB Insertion Loss", IEEE Electron Device Letters, vol. 33, No. 7, Jul. 2012.
Lim, S.F., et al., "Extremely High-Q Stacked Transformer-type Inductors for RF Applications", Chartered Semiconductor Manufacturing Ltd. & Nanyang Technological University, IEEE 2003.

* cited by examiner

*Primary Examiner* — Stephen W Smoot
*Assistant Examiner* — Sun Mi Kim King

(57) ABSTRACT

A reference circuit includes an integrated circuit (IC) formed on a semiconductor substrate including a first spiral inductor and a second spiral inductor. The first spiral inductor is formed from a first metal layer over the substrate. The second spiral inductor is formed from a second metal layer. The second spiral inductor is offset from the first spiral inductor and includes a first portion overlapping the first spiral inductor. A first capacitor includes a first terminal coupled to receive a radio frequency (RF) signal and a second terminal coupled to a first terminal of the first spiral inductor, and second capacitor includes a first terminal coupled to a second terminal of the first spiral inductor.

20 Claims, 3 Drawing Sheets

RADIO FREQUENCY (RF) INDUCTIVE SIGNAL COUPLER AND METHOD THEREFOR

BACKGROUND

Field

This disclosure relates generally to radio frequency (RF) electronic components, and more specifically, to RF couplers for use with electronic components.

Related Art

Today, portable wireless telephony, data, and Internet access products include greater functionality, higher performance, and lower cost. In addition, wireless applications are advancing to new markets—from radar-equipped passenger vehicles to biomedical devices that, when injected or inserted, send data to a receiver outside the body. The radio frequency (RF) sections of such wireless products generally include high performance passive components such as RF couplers used for signal level sensing and control. However, challenges remain in the further reduction of costs while concurrently simplifying fabrication processes and providing effective RF signal coupling and directionality.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a high directivity, electromagnetic radio frequency (RF) signal coupler. The RF coupler includes two spiral inductors which are weakly electromagnetically coupled (K«1). Capacitors are coupled in series between each inductor and associated ports of the RF coupler. Values of the series capacitors are selected to resonate with the self-inductance of each inductor at a desired operating frequency. The physical elements of the spiral inductors are configured to realize a coupling which provides a desired high directivity.

Figure 1:
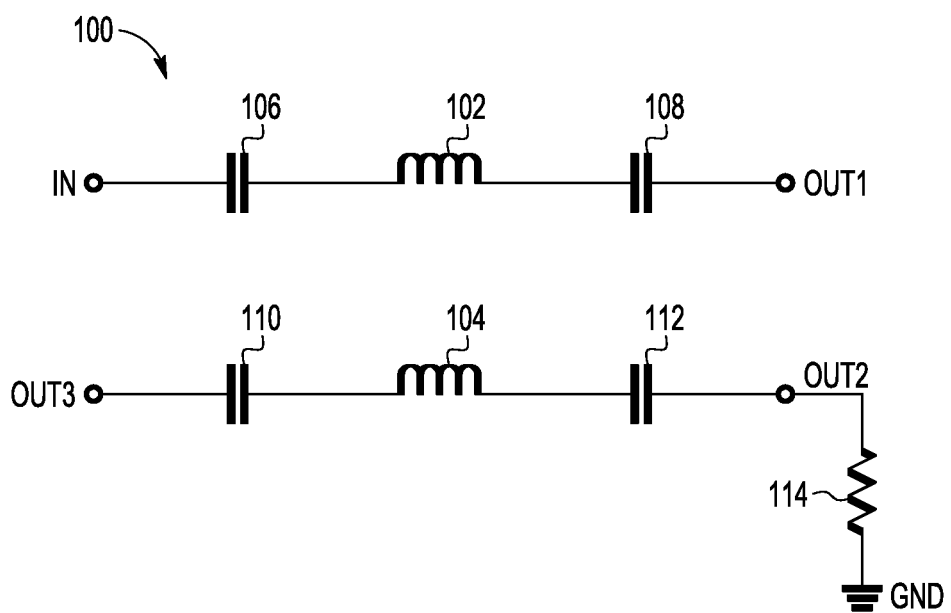
FIG. 1 illustrates, in schematic diagram form, an exemplary radio frequency (RF) coupler in accordance with an embodiment of the present disclosure.

FIG. 1 illustrates, in schematic diagram form, an exemplary radio frequency (RF) coupler circuit 100 in accordance with an embodiment of the present disclosure. RF coupler circuit 100 may be formed as a stand-alone packaged semiconductor device, or formed along with other circuitry as part of a packaged system. The topology depicted in the exemplary RF coupler circuit 100 of FIG. 1 includes an input port labeled IN, a first output port labeled OUT1, a second output port labeled OUT2, and a third output port labeled OUT3. An RF signal is provided at the first port IN, and a "through" or "direct" output signal is provided at the first output OUT1, a "coupled" output signal is provided at the second output OUT2, and an "isolated" output signal is provided at the third output OUT3. The direct output signal may be characterized as the transmitted portion of the RF signal having a majority of the signal power provided. The coupled output signal may be characterized as a low power version of the RF signal having about one-tenth of the power of the RF signal. For example, in a cellular telephony system, an RF transmitter may be coupled to the IN port, an antenna may be coupled to the OUT1 port, and signal monitor may be coupled to the OUT3 port.

RF coupler circuit 100 includes a first inductor 102 electromagnetically coupled to a second inductor 104. First and second capacitors 106 and 108 are coupled in series with inductor 102 between ports IN and OUT1 respectively. Third and fourth capacitors 110 and 112 are coupled in series with inductor 104 between ports OUT2 and OUT3 respectively. A first terminal of capacitor 106 is coupled to the IN port, and a second terminal of capacitor 106 is coupled to a first terminal of inductor 102. A second terminal of inductor 102 is coupled to a first terminal of capacitor 108, and a second terminal of capacitor 108 is coupled to the OUT1 port. A first terminal of capacitor 110 is coupled to the OUT3 port, and a second terminal of capacitor 110 is coupled to a first terminal of inductor 104. A second terminal of inductor 104 is coupled to a first terminal of capacitor 112, and a second terminal of capacitor 112 is coupled to the OUT2 port. Capacitance values of capacitors 106-112 are selected to resonate with the self-inductance of each inductor 102 and 104 at a desired operating frequency. In this embodiment, RF coupler circuit 100 includes a termination resistor having a first terminal coupled to the OUT2 port and a second terminal coupled to a voltage supply terminal labeled GND. A ground voltage is provided at the GND terminal.

Figure 2:
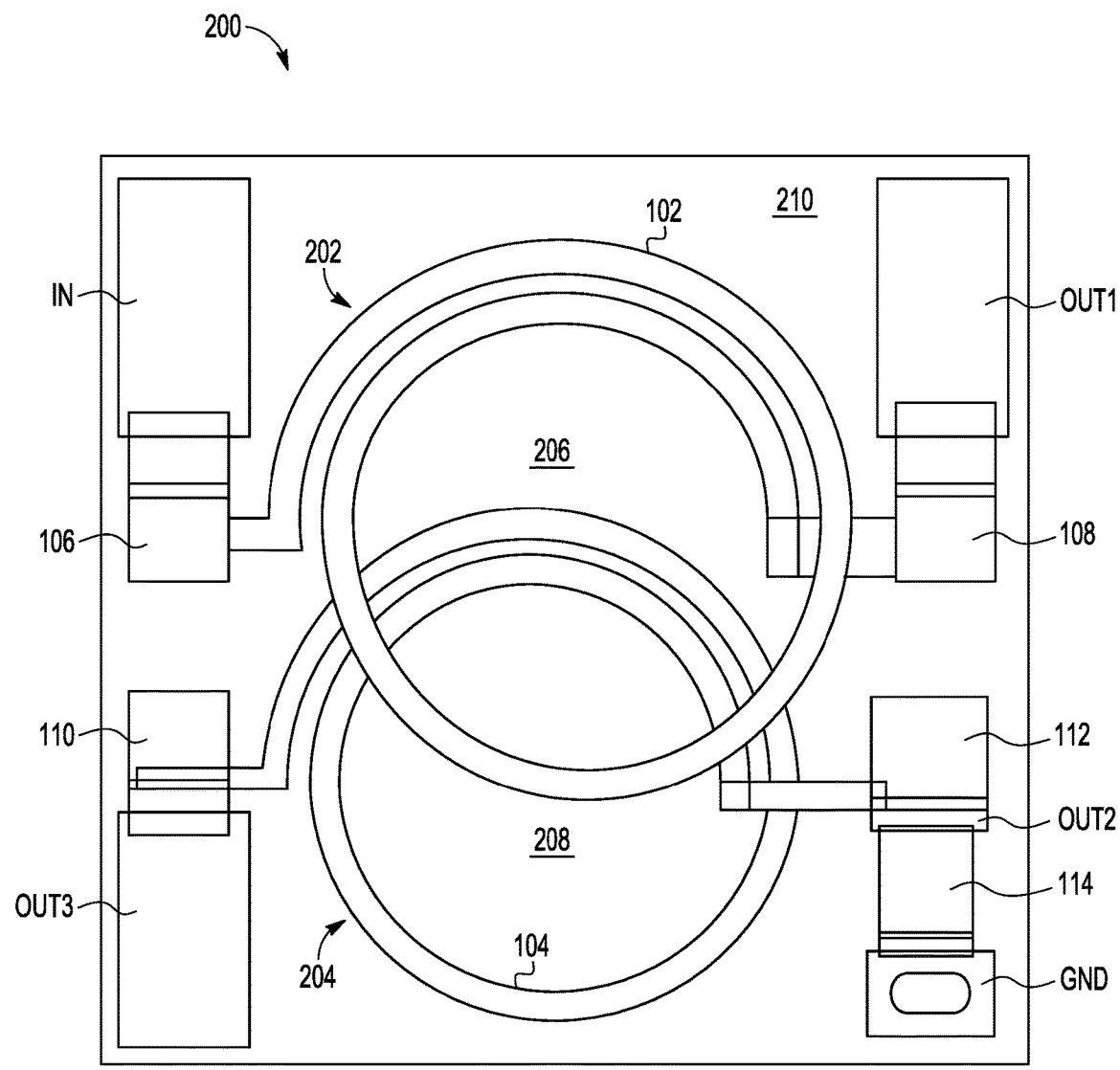
FIG. 2 illustrates, in a plan view, exemplary device layout of exemplary RF coupler in accordance with an embodiment of the present disclosure.

FIG. 2 illustrates, in a plan view, exemplary device layout of RF coupler circuit 100 formed on a common semiconductor substrate in accordance with an embodiment of the present disclosure. RF coupler layout 200 includes layout elements corresponding to components of RF coupler circuit 100. The RF coupler layout 200 shown in FIG. 2 may be formed on a common semiconductor substrate using a plurality of metal layers and a number of dielectric layers. The metal layers are deposited or otherwise formed on the substrate, and the desired conductive traces are etched or otherwise formed from the metal layers. The metal layers may typically be referred to as "metal 1," "metal 2," "metal 3," and so on to indicate the order in which they are deposited or formed on the substrate during the fabrication process. Accordingly, metal 1 layer is the lowest layer, metal 2 layer is a higher layer relative to the metal 1 layer, metal 3 layer is a higher layer relative to the metal 2 layer, and so on. For convenience of description, metal layers metal 1, metal 2, and so on may also be referred to as M1, M2, and so on.

In this embodiment, RF coupler layout 200 is formed as an integrated passive device (IPD) fabricated using semiconductor process technology. The layout elements of RF coupler layout 200 are formed on substrate 210. Substrate 210 may be formed as a semiconductor or insulating substrate, including for example, GaAs, Si, glass, ceramic, or the like. RF coupler layout 200 includes a first inductive element 202 formed as a first spiral shape having a portion overlapping a second inductive element 204 formed as a second spiral shape, corresponding to inductors 102 and 104 respectively of FIG. 1. The topology of the inductive elements 202 and 204 may be circular (as shown), or any other suitable shape such as octagonal, hexagonal, rectangular, and the like. The topology and number of turns of inductive elements 202 and 204 shown are not intended to limit or restrict the scope or application of the circuits described herein. Each of inductive elements 202 and 204 has an interior area 206 and 208 respectively, which is generally defined by the innermost turn of the spiral. The interior areas 206 and 208 are substantially equal.

In this embodiment, inductive element 204 is formed from a first metal layer M1 and inductive element 202 is formed from a second metal layer M2. Inductive elements 202 and 204 are separated by a dielectric layer formed between metal layers M1 and M2. Each inductive element 202 and 204 is implemented as a metal spiral including a metal line having a width and space, and a number of turns. The number of turns of the metal line is formed in approximate half-turn increments, preferably an odd integer number of half-turn increments. For example, spiral inductive elements 202 and 204 are each formed with three half-turn increments. It is also preferable for spiral inductive elements 202 and 204 to have similar configurations. For example, in addition to each inductive element 202 and 204 having a similar metal line width, space, and number of turns, it is also preferable to have similar orientation—where each spiral is formed with progressively smaller diameters when traversing the metal line in a clockwise manner. The spiral metal lines of inductive elements 202 and 204 may be formed using any fractional-turn increments to achieve a desired number of turns. Inductive elements 202 and 204 may also be referred to as spiral inductors 202 and 204.

In this embodiment, inductive element 202 is offset from inductive element 204 having a first portion of the metal spiral turns of inductive element 202 overlapping the interior area of inductive element 204. The amount of overlapping can be configured to achieve a desired coupling factor or coefficient (K) between inductive elements 202 and 204. For example, inductive element 202 may have a first overall area based on a diameter of outermost turn of inductive element 202, and similarly inductive element 204 may have a second overall area based on a diameter of outermost turn of inductive element 204. To achieve a desirable range of coupling coefficients, the first overall area may overlap the second overall area substantially in a range of 20-80%. In another example, it may be desirable to have a coupling coefficient much less than 1 (e.g., K=0.1), by having a first portion of the first overall area of inductive element 202 overlapping the second overall area of inductive element 204 by approximately 40%. In yet another example, it may be desirable to have the first portion of the first overall area of inductive element 202 overlapping the second overall area of inductive element 204 by at least approximately 20%, and have a second portion of the first overall area of inductive element 202 not overlapping the second overall area of inductive element 204 by at least approximately 20%.

Still referring to FIG. 2, capacitors 106-112 are formed as metal-insulator-metal (MIM) capacitors with metal layers M1 and M2 and dielectric separating M2 from M1. Capacitor 106 includes a first terminal coupled to a first terminal of inductive element 202, and a second terminal coupled to an input pad labeled IN. Capacitor 108 has a first terminal coupled to a second terminal of inductive element 202, and a second terminal coupled to a first output pad labeled OUT1. Likewise, capacitor 112 includes a first terminal coupled to a first terminal of inductive element 204, and a second terminal coupled to a second output labeled OUT2. Capacitor 110 has a first terminal coupled to a second terminal of inductive element 204, and a second terminal coupled to a third output pad labeled OUT3. Resistor 114 formed as a polysilicon structure (or as a thin film resistor) is coupled between output OUT2 and pad labeled GND. Each pad may be electrically coupled to a terminal on a package substrate using bond wires or configured in a flip-chip packaging arrangement.

It should be understood that inductive elements 202 and 204 may be formed from any two different metal layers whereby inductive element 204 is formed from a first metal layer above a second metal layer in which inductive element 202 is formed from and separated by one or more dielectric layers. Similarly, MIM capacitors 106-112 may be formed from any two different metal layer separated by one or more dielectric layer. The metal layers of inductive elements 202 and 204 may be formed from a variety of electrically conductive materials including, for example, copper, gold, silver, aluminum, nickel, tungsten, and alloys thereof. The one or more dielectric layers may be formed from a wide range of materials used for interlayer dielectrics, for example, including silicon dioxide, silicon nitride, silicon oxy-nitride, or the like and any combination of such layers providing electrical isolation. The line width, spacing, and thickness of metal layers and dielectric layers forming elements of the RF coupler layout 200 may be selected to suit a particular application and/or processing technology. Resistor 114 may be formed with any suitable resistive element.

Figure 3:
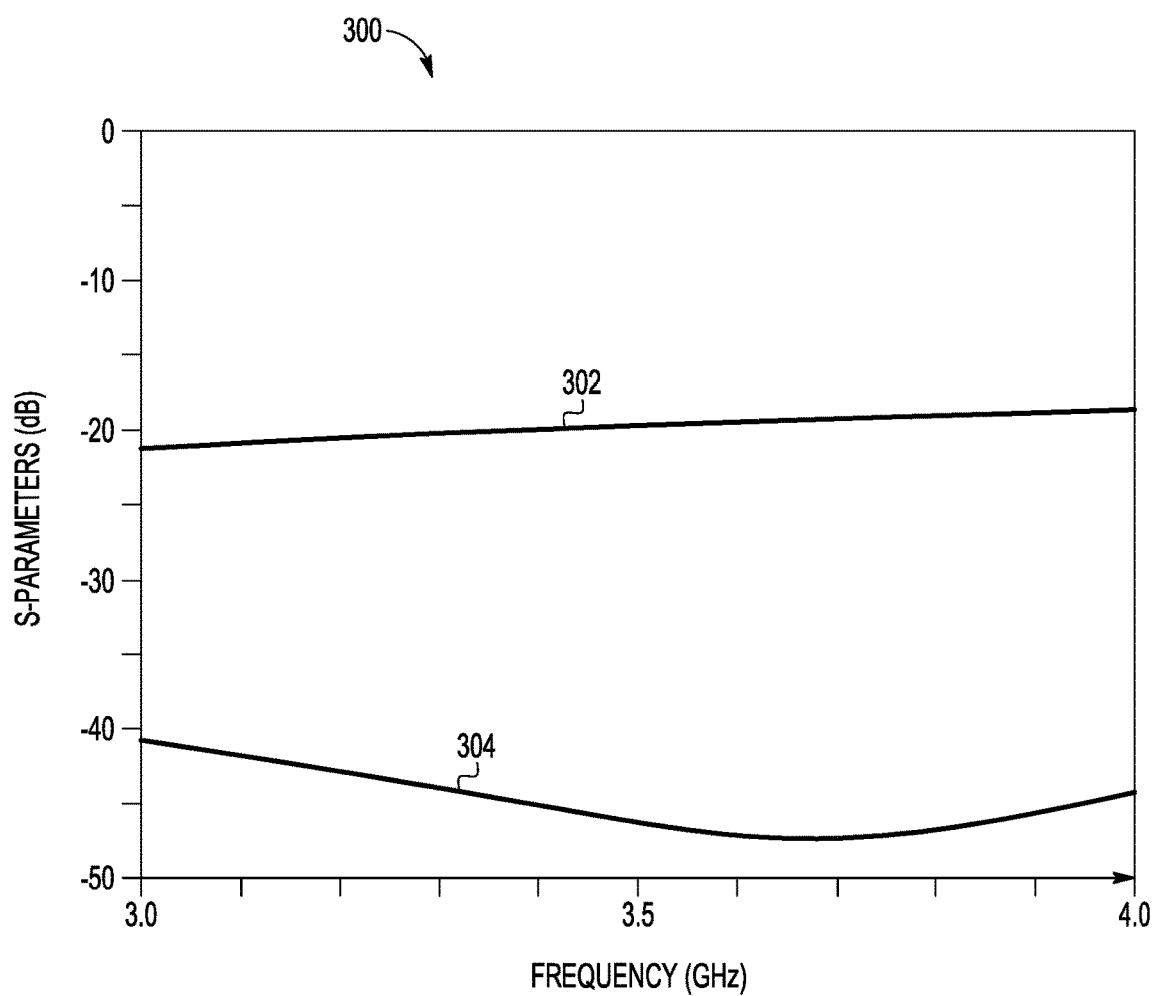
FIG. 3 illustrates, in plot diagram form, exemplary RF coupler simulation results in accordance with an embodiment of the present disclosure.

FIG. 3 illustrates, in plot diagram form, exemplary RF coupler simulation results in accordance with an embodiment of the present disclosure. Shown is simulated S-parameter results of the RF coupler embodiments depicted in FIGS. 1 and 2 versus frequency. Frequency values are shown in gigahertz (GHz) on the X-axis, and S-parameters are shown in decibels (dB) on the Y-axis. Plot diagram 300 includes waveforms illustrating simulated S-parameters S41 (302) and S42 (304) versus frequency. Waveform 302 is indicative of approximately 20 dB coupling factor at about 3.5 GHz and waveform 304 is indicative of approximately 46 dB isolation at about 3.5 GHz, resulting in approximately 26 dB directivity.

Generally, there is provided, an integrated circuit (IC) formed on a semiconductor substrate including: a first spiral inductor formed from a first metal layer over the substrate; a second spiral inductor formed from a second metal layer, the second spiral inductor offset from the first spiral inductor and having a first portion overlapping the first spiral inductor; a first capacitor having a first terminal coupled to receive a radio frequency (RF) signal and a second terminal coupled to a first terminal of the first spiral inductor; and a second capacitor having a first terminal coupled to a second terminal of the first spiral inductor. The second metal layer may be formed over the first metal layer, and wherein a first dielectric layer may be formed between the first metal layer and the second metal layer. The second spiral inductor may be configured to be electromagnetically coupled to the first spiral inductor. The integrated circuit may further include: a third capacitor having a first terminal coupled to a first terminal of the second spiral inductor, the third capacitor configured to provide a coupled signal at a second terminal of the third capacitor, the coupled signal corresponding to the RF signal; and a fourth capacitor having a first terminal coupled to a second terminal of the second spiral inductor. The integrated circuit may further include a first resistor having a first terminal coupled to a second terminal of the fourth capacitor, and a second terminal coupled to a first voltage supply terminal, wherein a ground voltage is provided at the first voltage supply terminal. The first spiral inductor and the second spiral inductor may be configured in a similar orientation, each having spiral metal line formed with progressively smaller diameters when traversing the metal line in a similar manner. The first spiral inductor and the second spiral inductor may each have an interior area defined by an innermost turn, wherein the interior area of the first spiral inductor may be substantially similar to the interior area of the second spiral inductor. The first spiral inductor and the second spiral inductor may each be formed with an odd integer number of half-turn increments. The first spiral inductor and the second spiral inductor may each have an overall area based on a diameter of an outermost turn, and wherein the overall area of the second spiral inductor overlaps the area of the first spiral inductor substantially in a range of 20-80%. The first capacitor and the second capacitor may each be formed as a metal-insulator-metal (MIM) capacitor, each MIM capacitor having a first plate formed from the first metal layer and a second plate formed from the second metal layer.

In another embodiment, there is provided, an integrated passive device (IPD) including: a first spiral inductor formed from a first metal layer over the substrate; a second spiral inductor formed from a second metal layer over the first metal layer, the second spiral inductor offset from the first spiral inductor and having a first portion overlapping the first spiral inductor; a first capacitor having a first terminal coupled to receive a radio frequency (RF) signal and a second terminal coupled to a first terminal of the first spiral inductor; a second capacitor having a first terminal coupled to a second terminal of the first spiral inductor and a second terminal coupled to a first output port; a third capacitor having a first terminal coupled to a first terminal of the second spiral inductor and a second terminal coupled to a second output port; and a fourth capacitor having a first terminal coupled to a second terminal of the second spiral inductor, and a second terminal coupled to a third output port. The first portion may be at least 20% of an overall area of the second spiral inductor, the overall area based on a diameter of an outermost turn of the second spiral inductor. The second spiral inductor may include a second portion that does not overlap the first spiral inductor, the second portion least 20% of the overall area of the second spiral inductor. The first, second, third, and fourth capacitors may each be formed as a metal-insulator-metal (MIM) capacitor, each MIM capacitor having a first plate formed from the first metal layer and a second plate formed from the second metal layer. The first spiral inductor and the second spiral inductor may each be formed with an odd integer number of substantially half-turn increments. The first portion overlapping the first spiral inductor may include at least a portion of one or more turns of the second spiral inductor overlapping an interior area of the first spiral inductor, the interior area defined by an innermost turn of the first spiral inductor. The integrated passive device may further include a first resistor having a first terminal coupled to the second output port, and a second terminal coupled to a first voltage supply terminal, wherein a ground voltage is provided at the first voltage supply terminal.

In yet another embodiment, there is provided, a method including: forming a first spiral inductor from a first metal layer over a substrate; forming a second spiral inductor from a second metal layer over the first metal layer, the second spiral inductor offset from the first spiral inductor and having a first portion overlapping the first spiral inductor; forming first, second, third, and fourth capacitors having a first plate formed from the first metal layer and a second plate formed from the second metal layer: the first capacitor having a first terminal coupled to receive a radio frequency (RF) signal and a second terminal coupled to a first terminal of the first spiral inductor; the second capacitor having a first terminal coupled to a second terminal of the first spiral inductor and a second terminal coupled to a first output port; the third capacitor having a first terminal coupled to a first terminal of the second spiral inductor and a second terminal coupled to a second output port; and the fourth capacitor having a first terminal coupled to a second terminal of the second spiral inductor, and a second terminal coupled to a third output port. A coupled version of the RF signal may be provided at the third output port. The first spiral inductor and the second spiral inductor may each be formed with an odd integer number of substantially half-turn increments.

By now it should be appreciated that there has been provided, a high directivity, electromagnetic radio frequency (RF) signal coupler. The RF coupler includes two spiral inductors which are weakly electromagnetically coupled (K«1). Capacitors are coupled in series between each inductor and associated ports of the RF couple. Values of the series capacitors are selected to resonate with the self-inductance of each inductor at a desired operating frequency. The physical elements of the spiral inductors are configured to realize a coupling which provides a desired high directivity.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit (IC) formed on a semiconductor substrate comprising:
   a first spiral inductor formed from a first metal layer over the substrate;
   a second spiral inductor formed from a second metal layer, the second spiral inductor offset from the first spiral inductor and having a first portion overlapping the first spiral inductor;
   a first capacitor having a first terminal coupled to receive a radio frequency (RF) signal and a second terminal coupled to a first terminal of the first spiral inductor; and
   a second capacitor having a first terminal coupled to a second terminal of the first spiral inductor;
   wherein the first capacitor and the second capacitor are each formed as a metal-insulator-metal (MIM) capacitor, each MIM capacitor having a first plate formed from the first metal layer and a second plate formed from the second metal layer.

2. The integrated circuit of claim 1, wherein the second metal layer is formed over the first metal layer, and wherein a first dielectric layer is formed between the first metal layer and the second metal layer.

3. The integrated circuit of claim 1, wherein the second spiral inductor is configured to be electromagnetically coupled to the first spiral inductor.

4. The integrated circuit of claim 1, further comprising:
   a third capacitor having a first terminal coupled to a first terminal of the second spiral inductor, the third capacitor configured to provide a coupled signal at a second terminal of the third capacitor, the coupled signal corresponding to the RF signal; and
   a fourth capacitor having a first terminal coupled to a second terminal of the second spiral inductor.

5. The integrated circuit of claim 4, further comprising a first resistor having a first terminal coupled to a second terminal of the fourth capacitor, and a second terminal coupled to a first voltage supply terminal, wherein a ground voltage is provided at the first voltage supply terminal.

6. The integrated circuit of claim 1, wherein the first spiral inductor and the second spiral inductor are configured in a similar orientation, each having spiral metal line formed with progressively smaller diameters when traversing the metal line in a similar manner.

7. The integrated circuit of claim 1, wherein the first spiral inductor and the second spiral inductor each have an interior area defined by an innermost turn, wherein the interior area of the first spiral inductor is substantially similar to the interior area of the second spiral inductor.

8. The integrated circuit of claim 1, wherein the first spiral inductor and the second spiral inductor are each formed with an odd integer number of half-turn increments.

9. The integrated circuit of claim 1, wherein the first spiral inductor and the second spiral inductor each have an overall area based on a diameter of an outermost turn, and wherein the overall area of the second spiral inductor overlaps the area of the first spiral inductor substantially in a range of 20-80%.

10. An integrated passive device (IPD) comprising:
    a first spiral inductor formed from a first metal layer over the substrate;
    a second spiral inductor formed from a second metal layer over the first metal layer, the second spiral inductor offset from the first spiral inductor and having a first portion overlapping the first spiral inductor;
    a first capacitor having a first terminal coupled to receive a radio frequency (RF) signal and a second terminal coupled to a first terminal of the first spiral inductor;
    a second capacitor having a first terminal coupled to a second terminal of the first spiral inductor and a second terminal coupled to a first output port;
    a third capacitor having a first terminal coupled to a first terminal of the second spiral inductor and a second terminal coupled to a second output port; and
    a fourth capacitor having a first terminal coupled to a second terminal of the second spiral inductor, and a second terminal coupled to a third output port.

11. The integrated passive device of claim 10, wherein the first portion is at least 20% of an overall area of the second spiral inductor, the overall area based on a diameter of an outermost turn of the second spiral inductor.

12. The integrated passive device of claim 11, wherein the second spiral inductor includes a second portion that does not overlap the first spiral inductor, the second portion least 20% of the overall area of the second spiral inductor.

13. The integrated passive device of claim 10, wherein the first, second, third, and fourth capacitors are each formed as a metal-insulator-metal (MIM) capacitor, each MIM capacitor having a first plate formed from the first metal layer and a second plate formed from the second metal layer.

14. The integrated passive device of claim 10, wherein the first spiral inductor and the second spiral inductor are each formed with an odd integer number of substantially half-turn increments.

15. The integrated passive device of claim 10, wherein the first portion overlapping the first spiral inductor includes at least a portion of one or more turns of the second spiral inductor overlapping an interior area of the first spiral inductor, the interior area defined by an innermost turn of the first spiral inductor.

16. The integrated passive device of claim 10, further comprising a first resistor having a first terminal coupled to the second output port, and a second terminal coupled to a first voltage supply terminal, wherein a ground voltage is provided at the first voltage supply terminal.

17. A method comprising:
forming a first spiral inductor from a first metal layer over a substrate;
forming a second spiral inductor from a second metal layer over the first metal layer, the second spiral inductor offset from the first spiral inductor and having a first portion overlapping the first spiral inductor;
forming first, second, third, and fourth capacitors having a first plate formed from the first metal layer and a second plate formed from the second metal layer:
the first capacitor having a first terminal coupled to receive a radio frequency (RF) signal and a second terminal coupled to a first terminal of the first spiral inductor;
the second capacitor having a first terminal coupled to a second terminal of the first spiral inductor and a second terminal coupled to a first output port;
the third capacitor having a first terminal coupled to a first terminal of the second spiral inductor and a second terminal coupled to a second output port; and
the fourth capacitor having a first terminal coupled to a second terminal of the second spiral inductor, and a second terminal coupled to a third output port.

18. The method of claim 17, wherein a coupled version of the RF signal is provided at the third output port.

19. The method of claim 17, wherein the first spiral inductor and the second spiral inductor are each formed with an odd integer number of substantially half-turn increments.

20. An integrated circuit (IC) formed on a semiconductor substrate comprising:
a first spiral inductor formed from a first metal layer over the substrate;
a second spiral inductor formed from a second metal layer, the second spiral inductor offset from the first spiral inductor and having a first portion overlapping the first spiral inductor;
a first capacitor having a first terminal coupled to receive a radio frequency (RF) signal and a second terminal coupled to a first terminal of the first spiral inductor; and
a second capacitor having a first terminal coupled to a second terminal of the first spiral inductor;
a third capacitor having a first terminal coupled to a first terminal of the second spiral inductor, the third capacitor configured to provide a coupled signal at a second terminal of the third capacitor, the coupled signal corresponding to the RF signal; and
a fourth capacitor having a first terminal coupled to a second terminal of the second spiral inductor.

\* \* \* \* \*